United States Patent [19]

Andrascek et al.

[11] Patent Number: 4,652,336

[45] Date of Patent: Mar. 24, 1987

[54] METHOD OF PRODUCING COPPER PLATFORMS FOR INTEGRATED CIRCUITS

[75] Inventors: Ernst Andrascek; Hans Hadersbeck, both of Munich, Fed. Rep. of Germany

[73] Assignee: Siemens Aktiengesellschaft, Berlin and Munich, Fed. Rep. of Germany

[21] Appl. No.: 767,641

[22] Filed: Aug. 20, 1985

[30] Foreign Application Priority Data

Sep. 20, 1984 [DE] Fed. Rep. of Germany ....... 3434580

[51] Int. Cl.⁴ ........................... C23F 1/02; B44C 1/22; C03C 15/00; C03C 25/06
[52] U.S. Cl. ..................................... 156/652; 29/591; 156/656; 156/659.1; 156/664; 156/666; 204/15; 204/38.5; 204/192.3; 204/192.35; 357/71; 427/90
[58] Field of Search .................... 29/589, 590, 591; 357/71; 204/15, 34.5, 38.5, 192 C, 192 EC, 192 E, 192 R; 156/652, 656, 659.1, 662, 664, 666; 427/88–90

[56] References Cited

U.S. PATENT DOCUMENTS

| 3,791,952 | 2/1974 | Labuda et al. | 204/192 EC |
| 4,087,314 | 5/1978 | George et al. | 156/656 X |
| 4,341,594 | 7/1982 | Carlson et al. | 156/656 X |

*Primary Examiner*—William A. Powell
*Attorney, Agent, or Firm*—Hill, Van Santen, Steadman & Simpson

[57] ABSTRACT

A method for producing a copper platform on integrated circuits formed on a semiconductor wafer wherein an aluminum layer is back-sputtered over the circuits to provide contact surfaces thereon, followed by sputtering on successive layers of titanium and copper on the aluminum layer. A copper platform is electrolytically built up above the aluminum layer and thereafter the copper layer is etched away. The copper platform is then metallized by electroless deposition, and finally the titanium layer is etched away.

7 Claims, 1 Drawing Figure

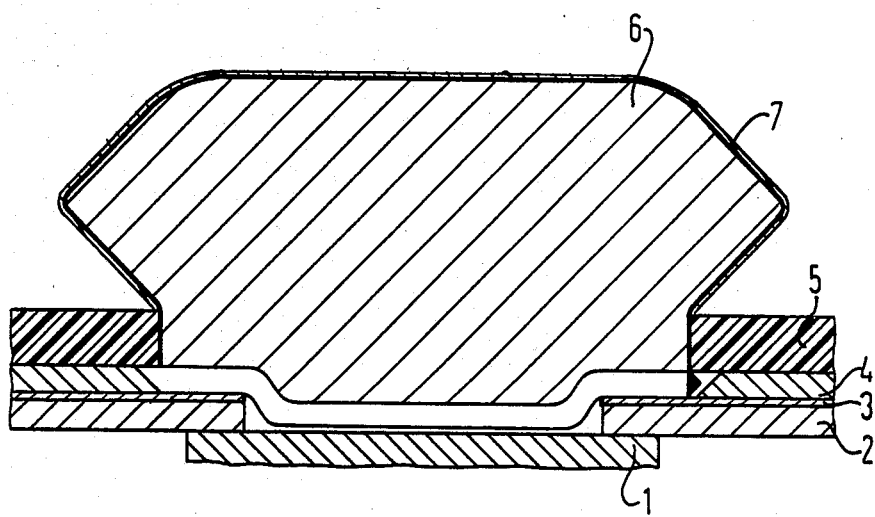

METHOD OF PRODUCING COPPER PLATFORMS FOR INTEGRATED CIRCUITS

BACKGROUND OF THE INVENTION

1. Field of the Invention

This invention is in the field of producing copper platforms on integrated circuits involving a combination of sputtering and electrolytic deposition.

2. Description of the Prior Art

It is well known to apply integrated circuits to a silicon wafer. These integrated circuits have terminal points or sites for electrical contacting. These contact sites are usually composed of aluminum. They are specifically suited for wire bonding techniques.

Other connecting techniques used with integrated circuits such, for example, as soldering, require platforms for the contacting of the contact sites to the integrated circuit. These platforms must be highly solderable.

For producing the platforms, the contact sites are made of aluminum. The semiconductor wafer which is passivated with a protective nitride is first activated in a wet chemical process and is then vapor deposited with, for example, a 0.2 micron thick titanium layer and, for example, a 2 to 3 micron thick copper layer. This is followed by a tempering process of the wafer as required. Following this, there is a structuring of the contact sites by means of the conventional photo technique which is followed by the platform build-up in an electrolytic bath. After the electrolytic platform build-up, the photoresist layer is delaminated and a thin copper layer as well as the titanium layer are removed in corresponding etching agents. After an activation of the copper platforms, they are metallized in an electroless nickel or gold bath. In order to reduce the disturbing photoelectric effects at the pn/np junctions, the electroless metallization is carried out in a darkened room. To prevent a destruction of the integrated circuits on the wafer, the exposure times in the electroless baths are strictly limited.

SUMMARY OF THE INVENTION

The present invention provides a method sequence wherein the electrolytically constructed copper platforms on the semiconductor wafers passivated with protective nitrides retain their crowned, shiny surfaces and in order to achieve an extremely good solderability, are provided with a metal layer of gold, gold-tin alloy, nickel-gold alloy, or tin which is uniformly applied in an electroless process.

The photoelectric effect which otherwise occurs at pn/np junctions should thereby be totally suppressed so that a uniform, electroless metallization of all the copper platforms becomes possible.

In accordance with the present invention, the integrated circuits are no longer capable of being destroyed by chemical baths during the electrolytic platform production as well as during the electroless metallization due to a defective protective nitride passivation, regardless of how long they remain in the electrolytic or electroless metallization bath. The protective nitride passivation is only exposed to the least possible stress due to chemical solutions.

DESCRIPTION OF THE PREFERRED EMBODIMENTS

The method of the present invention is composed of a series of steps as follows. First, an aluminum layer is back-sputtered over the integrated circuits to provide contact surfaces thereon. This is followed by sputtering a titanium as well as a copper layer. Then, there is an electrolytic build-up of the copper-nickel platforms. The copper layer is removed in a copper etching solution or a lustering material at room temperature. Next, there is an electroless metallization of the copper platforms, and finally the titanium layer is removed in a titanium etching solution. The titanium layer can be about 0.1 micron thick and the copper layer can be 0.5 micron thick, for example.

In order to achieve optimum platform surfaces, the thin copper layer can be removed in an ammonium peroxo-disulfate etching solution and subsequently the copper platforms can be smoothed in a lustering preparation at room temperature.

A significant advantage of the method of the present invention resides in that the back-sputtering avoids an involved wet chemical process for the elimination of the aluminum oxide. A tempering process is also thus eliminated. The thin copper layer, furthermore, has the advantage of good adjustability of the mask for the platform structure. Beyond this, the etching time in the removal of the copper layer is reduced to a minimum.

By employing a copper lustering preparation in contrast to a copper etching solution, the good electrolytic surface of the copper platforms is not altered in a negative way.

The electroless metallization of the copper platforms is carried out while the full titanium layer is still present. It has been found that the electroless metallization selectively deposits only on copper or nickel but not on titanium. In this way, there is a light tight protection and short-circuiting of the integrated circuits during the electroless metallization due to the disruptive influence of the photoelectric effect is suppressed. A uniform metallization of all copper platforms can thereby be produced. A further advantage occurring from the presence of the titanium layer is that the entire wafer surface is protected against chemical attack during the electroless metallization. The exposure times in the metallization baths are therefore no longer critical. No attack of the metallized platforms occurs when the titanium layer is removed in a titanium etching solution.

The single FIGURE in the drawings illustrates an embodiment of the present invention for producing copper platforms.

In the drawing, reference numeral 1 has been applied to an aluminum contact surface. The entire semiconductor wafer, except for the contact surface 1, is covered by means of a protective nitride layer 2. The titanium layer 3 extends over the full surface of the wafer. A copper layer 4 is applied thereover, for example, by being sputtered on. A photoresist structure for the platform is indicated at reference numeral 5. The electrolytically formed platform structure 6 composed of copper is covered with a layer 7 of gold, nickel-gold, or other metals. The layer 7 may also consist of an electrolytically nickel plated layer of about 2 microns in thickness. Subsequently, the copper layer 4 and the titanium layer 3 are removed by etching from the wafer up to the edge of the platform.

It should be evident that various modifications can be made to the described embodiments without departing from the scope of the present invention.

We claim as our invention:

1. A method for producing a copper platform on integrated circuits formed on a semiconductor wafer which comprises:
   back-sputtering an aluminum layer over said circuits to provide contact surfaces thereon,
   sputtering on successive layers of titanium and copper on said aluminum layer,
   electrolytically building up a copper platform above said aluminum layer,
   etching away said copper layer,
   metallizing said copper platform with a gold containing layer by electroless deposition or a nickel layer without depositing on said titanium layer, and
   etching away said titanium layer.

2. A method according to claim 1 wherein said copper layer is etched away at substantially room temperature.

3. A method according to claim 1 in which said titanium layer is deposited to a thickness of about 0.1 micron.

4. A method according to claim 3 wherein said copper layer is deposited to a thickness of about 0.5 micron.

5. A method according to claim 1 wherein said copper layer is etched away by means of an ammonium peroxo-disulfate etching solution.

6. A method according to claim 5 which includes the step of subsequently smoothing the copper platform in a polishing bath at substantially room temperature.

7. A method according to claim 1 wherein said copper platform is electrolytical nickel plated to a thickness of about 2 micron.

* * * * *